United States Patent
Jung et al.

(10) Patent No.: US 8,791,634 B2
(45) Date of Patent: Jul. 29, 2014

(54) ORGANIC LIGHT EMITTING DISPLAY APPARATUS AND METHOD OF MANUFACTURING THE SAME

(75) Inventors: Sun-Young Jung, Yongin (KR);
Jin-Hwan Jeon, Yongin (KR);
Seung-Yong Song, Yongin (KR);
Ji-Young Moon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 114 days.

(21) Appl. No.: 13/221,124

(22) Filed: Aug. 30, 2011

(65) Prior Publication Data

US 2012/0104933 A1     May 3, 2012

(30) Foreign Application Priority Data

Oct. 27, 2010 (KR) .......................... 10-2010-0105375

(51) Int. Cl.
*H01L 51/50* (2006.01)
*H01L 51/56* (2006.01)

(52) U.S. Cl.
USPC ............................... 313/512; 313/506; 445/25

(58) Field of Classification Search
USPC ............................... 313/500–512; 445/24, 25
See application file for complete search history.

(56) References Cited

U.S. PATENT DOCUMENTS

| | | | |
|---|---|---|---|
| 8,134,293 B2 * | 3/2012 | Logunov et al. | 313/512 |
| 8,299,705 B2 * | 10/2012 | Choi | 313/512 |
| 8,362,993 B2 * | 1/2013 | Nakagawa | 349/153 |
| 2006/0082298 A1 | 4/2006 | Becken et al. | |
| 2007/0128967 A1 | 6/2007 | Becken et al. | |
| 2007/0176553 A1 * | 8/2007 | Kwak | 313/512 |
| 2007/0273821 A1 * | 11/2007 | Liou et al. | 349/153 |
| 2009/0142984 A1 * | 6/2009 | Logunov et al. | 445/25 |
| 2009/0295277 A1 * | 12/2009 | Logunov et al. | 313/504 |
| 2011/0014731 A1 * | 1/2011 | Nguyen et al. | 438/26 |
| 2013/0153141 A1 * | 6/2013 | Lee et al. | 156/273.3 |

FOREIGN PATENT DOCUMENTS

| | | |
|---|---|---|
| KR | 10-2006-0115070 | 11/2006 |
| KR | 10-2007-0078501 | 8/2007 |
| KR | 10-2007-0085333 | 8/2007 |
| KR | 10-2007-0088671 | 8/2007 |
| KR | 10-0754120 | 8/2007 |

\* cited by examiner

*Primary Examiner* — Mariceli Santiago
(74) *Attorney, Agent, or Firm* — Robert E. Bushnell, Esq.

(57) ABSTRACT

In an organic light emitting display apparatus and a method of manufacturing the same, the organic light emitting display apparatus comprises: a first substrate, one surface of which is divided into a non-display area and a display area including an organic light emitting diode (OLED); a second substrate, one surface of which faces the one surface of the first substrate; and a bonding member disposed between the first and second substrates so as to surround the display area of the first substrate, and bonding the first and second substrates to each other to define an inner portion including the display area and an outer portion including the non-display area. A bonding portion formed by the bonding member includes an effective bonding portion and a non-effective bonding portion. The non-effective bonding portion includes an inner non-effective bonding portion contacting one side of the effective bonding portion and disposed adjacent to the inner portion, and an outer non-effective bonding portion contacting another side of the effective bonding portion and disposed adjacent to the outer portion by interposing the effective bonding portion between the inner and outer non-effective bonding portions.

6 Claims, 7 Drawing Sheets

ORGANIC LIGHT EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Oct. 27, 2010 and there duly assigned Serial No. 10-2010-0105375.

BACKGROUND OF THE INVENTION

1. Field of the Invention

The present invention relates to an organic light emitting display apparatus and a method of manufacturing the same.

2. Description of the Related Art

An organic light emitting display apparatus includes a lower substrate for providing a display area and a non-display area, and an encapsulation substrate disposed for encapsulation so as to face the lower substrate and bonded to the lower substrate by a bonding member. The bonding member is disposed so as to surround the display area. The bonding member may define an inner portion including the display area and an outer portion including the non-display area.

When the organic light emitting display apparatus is manufactured, cracks may occur in a bonding portion formed by the bonding member. A problem is caused if cracks occur in a bonding portion which is disposed adjacent to the outer portion. Moisture may penetrate through the cracks of the bonding portion in a cleaning process of the organic light emitting display apparatus, and thus moisture penetration is observed with bare eyes. Accordingly, the organic light emitting display apparatus having cracks may be regarded as a defective apparatus.

SUMMARY OF THE INVENTION

The present invention provides an organic light emitting display apparatus capable of reducing a defect rate in the manufacturing process by adjusting a position for irradiating a laser beam so as to form an effective bonding portion at a predetermined position, and a method of manufacturing the same.

According to an aspect of the present invention, an organic light emitting display apparatus comprises: a first substrate, one surface of which is divided into a non-display area and a display area including an organic light emitting diode (OLED); a second substrate, one surface of which faces the one surface of the first substrate; and a bonding member disposed between the first and second substrates so as to surround the display area of the first substrate, the bonding member bonding the first and second substrates to each other so as to define an inner portion including the display area and an outer portion including the non-display area. In addition, the bonding portion formed by the bonding member includes an effective bonding portion and a non-effective bonding portion, wherein the non-effective bonding portion includes an inner non-effective bonding portion contacting one side of the effective bonding portion and disposed adjacent to the inner portion, and an outer non-effective bonding portion contacting another side of the effective bonding portion and disposed adjacent to the outer portion, by interposing the effective bonding portion between the inner and outer non-effective bonding portions. Furthermore, the width of the inner non-effective bonding portion is greater than the width of the outer non-effective bonding portion.

The bonding member may be melted by a laser beam irradiated onto another surface of the first substrate or onto another surface of the second substrate so as to form the bonding portion.

The width of the outer non-effective bonding portion may be equal to or less than 15% of the width of the bonding member.

The width of the effective bonding portion may be equal to or less than 70% to 90% of the width of the bonding member.

According to another aspect of the present invention, an organic light emitting display apparatus comprises: a first substrate, one surface of which is divided into a non-display area and a display area including an organic light emitting diode (OLED); a second substrate, one surface of which faces the one surface of the first substrate; and a bonding member disposed between the first and second substrates so as to surround the display area of the first substrate, the bonding member bonding the first and second substrates to each other so as to define an inner portion including the display area and an outer portion including the non-display area. The bonding portion formed by the bonding member includes an effective bonding portion disposed adjacent to the outer portion and a non-effective bonding portion disposed adjacent to the inner portion.

The bonding member may be melted by a laser beam irradiated onto another surface of the first substrate or onto another surface of the second substrate so as to form the bonding portion.

The width of the effective bonding portion may be equal to or less than 70% to 90% of the width of the bonding member.

According to another aspect of the present invention, a method of manufacturing an organic light emitting display apparatus comprises: providing a first substrate, one surface of which is divided into a non-display area and a display area including an organic light emitting diode (OLED); disposing a bonding member on the one surface of the second substrate so as to surround the display area of the first substrate and so as to define an inner portion including the display area and an outer portion including the non-display area; disposing the second substrate on the first substrate in such a way that the one surface of the second substrate faces the one surface of the first substrate; irradiating a laser beam onto another surface of the first substrate or onto another surface of the second substrate so as to correspond to a position of the bonding member; and bonding the first and second substrates to each other as the bonding member is melted by the laser beam so as to form a bonding portion including an effective bonding portion and a non-effective bonding portion. The laser beam is irradiated in such a way that a central axis of the laser beam is biased toward the outer portion from a center of a width of the bonding member.

The laser beam may have a Gaussian distribution, and energy may be highest at the central axis of the laser beam.

The laser beam may include an effective energy range for forming the effective bonding portion and a non-effective energy range for forming the non-effective bonding portion, and the effective energy range may be a range corresponding to 60% to 80% of a total width of the laser beam with respect to the central axis of the laser beam.

The non-effective bonding portion may include an inner non-effective bonding portion contacting one side of the effective bonding portion and disposed adjacent to the inner portion, and an outer non-effective bonding portion contacting another side of the effective bonding portion and disposed adjacent to the outer portion, by interposing the effective bonding portion between the inner and outer non-effective bonding portions, and the effective energy range of the laser beam may be irradiated so as to be biased toward the outer portion in such a way that the width of the inner non-effective bonding portion is greater than the width of the outer non-effective bonding portion.

The effective energy range of the laser beam may be irradiated so as to be biased toward the outer portion in such a way that the width of the outer non-effective bonding portion is equal to or less than 15% of the width of the bonding member.

The effective energy range of the laser beam may be irradiated so as to be biased toward the outer portion in such a way that the effective bonding portion is disposed adjacent to the outer portion and the non-effective bonding portion is disposed adjacent to the inner portion.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
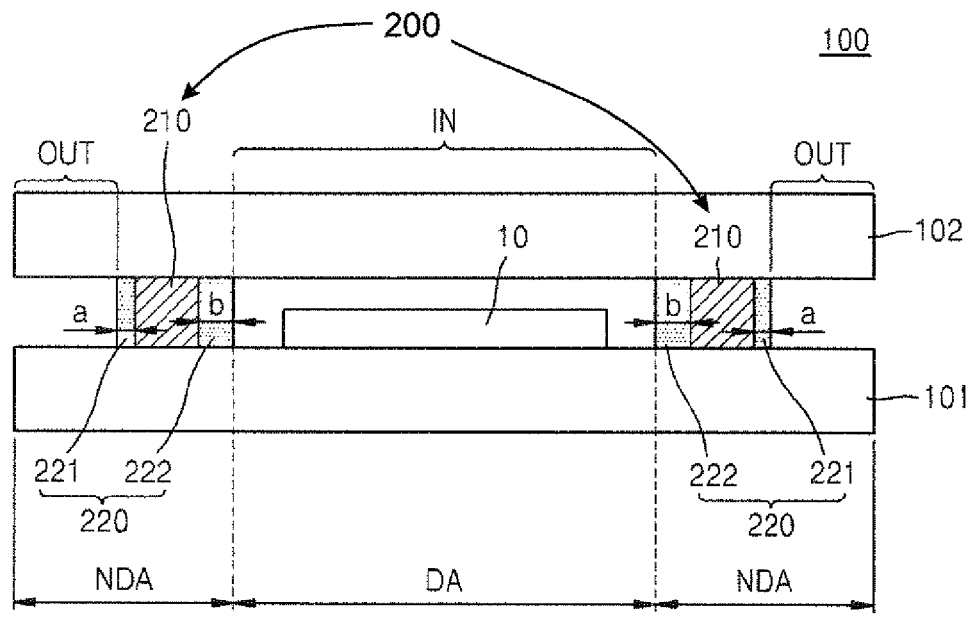
FIG. 1 is a cross-sectional view of an organic light emitting display apparatus according to a first embodiment of the present invention.

While exemplary embodiments of the invention are susceptible to various modifications and alternative forms, specific embodiments thereof are shown by way of example in the drawings and will herein be described in detail. It should be understood, however, that there is no intent to limit exemplary embodiments of the invention to the particular forms disclosed but, conversely, exemplary embodiments of the invention are intended to cover all modifications, equivalents and alternatives falling within the spirit and scope of the invention. In the following description of the present invention, a detailed description of known functions and configurations incorporated herein will be omitted when it may make the subject matter of the present invention unclear.

It will be understood that, although the terms first, second, etc. may be used herein to describe various elements, these elements should not be limited by these terms. These terms are only used to distinguish one element from another.

The terminology used herein is for the purpose of describing particular embodiments only, and is not intended to be limiting of exemplary embodiments of the invention. As used herein, the singular forms "a", "an" and "the" are intended to include the plural forms as well unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Hereinafter, the present invention will be described in detail by explaining embodiments of the invention with reference to the attached drawings.

FIG. 1 is a cross-sectional view of an organic light emitting display apparatus according to a first embodiment of the present invention.

Referring to FIG. 1, the organic light emitting display apparatus 100 includes a first substrate 101 including a display unit 10 comprising an organic light emitting diode (OLED), a second substrate 102 facing the first substrate 101, and a bonding member 200 disposed between the first and second substrates 101 and 102, respectively, so as to bond the first and second substrates 101 and 102, respectively, to each other.

One surface of the first substrate 101 is divided into a display area DA and a non-display area NDA. The display area DA includes the display unit 10 in which pixels, each including an OLED, a thin film transistor (TFT), a capacitor, etc., are formed in a matrix. The non-display area NDA is an area other than the display area DA, and is generally disposed so as to surround the display area DA. The bonding member 200 may be disposed in the non-display area NDA.

The second substrate 102 is an encapsulation substrate for encapsulating the display area DA of the first substrate 101 by using the bonding member 200. One surface of the second substrate 102 faces the one surface of the first substrate 101.

The bonding member 200 bonds the first and second substrates 101 and 102, respectively, to each other, and may be formed of one of various materials, e.g., a sealant such as epoxy, and glass frit. The bonding member 200 is disposed between the first and second substrates 101 and 102, respectively. Also, the bonding member 200 is disposed so as to surround the display area DA of the first substrate 101. The bonding member 200 may be disposed on a portion of the non-display area NDA. The bonding member 200 defines an inner portion IN and an outer portion OUT. The inner portion IN is a portion inside the bonding member 200, and includes the display area DA, and is encapsulated from the external air by the bonding member 200 and the second substrate 102. The outer portion OUT is a portion outside the bonding member 200 and includes the non-display area NDA. The outer portion OUT is opposite to the inner portion IN by interposing the bonding member 200 therebetween. The bonding member 200 is melted by a laser beam irradiated from another surface of the first substrate 101 or another surface of the second substrate 102 so as to form a bonding portion. According to the current embodiment of the present invention, the bonding portion includes an effective bonding portion 210 and anon-effective bonding portion 220.

The effective bonding portion 210 is a portion substantially involved in bonding between the first and second substrates 101 and 102, respectively. That is, the effective bonding portion 210 is a portion melted by an effective energy range (ER) of a laser beam. The effective bonding portion 210 is also referred to as an effective width or a solid line. The non-effective bonding portion 220 is a portion not substantially involved in bonding between the first and second substrates 101 and 102, respectively. That is, the non-effective bonding portion 220 is a portion melted by a non-effective energy range (NER) of the laser beam. Here, energy intensity of the effective energy range (ER) of the laser beam is greater than the energy intensity of the non-effective energy range (NER) of the laser beam. The energy intensities of the effective and non-effective energy ranges ER and NER, respectively, of the laser beam will be described in detail later.

According to the current embodiment of the present invention, the non-effective bonding portion 220 is divided into an inner non-effective bonding portion 222 and an outer non-effective bonding portion 221 by interposing the effective bonding portion 210 therebetween. The inner non-effective bonding portion 222 contacts one side of the effective bonding portion 210 and is disposed adjacent to the inner portion IN. The outer non-effective bonding portion 221 contacts another side of the effective bonding portion 210 and is disposed adjacent to the outer portion OUT. That is, as illustrated in FIG. 1, the inner non-effective bonding portion 222, the effective bonding portion 210, and the outer non-effective bonding portion 221 are sequentially formed in a direction from the inner portion IN to the outer portion OUT. According to the current embodiment of the present invention, a width b of the inner non-effective bonding portion 222 is greater than a width a of the outer non-effective bonding portion 221. The widths b and a of the inner and outer non-effective bonding portions 222 and 221, respectively, will be described in detail later with reference to FIG. 3.

Figure 2:
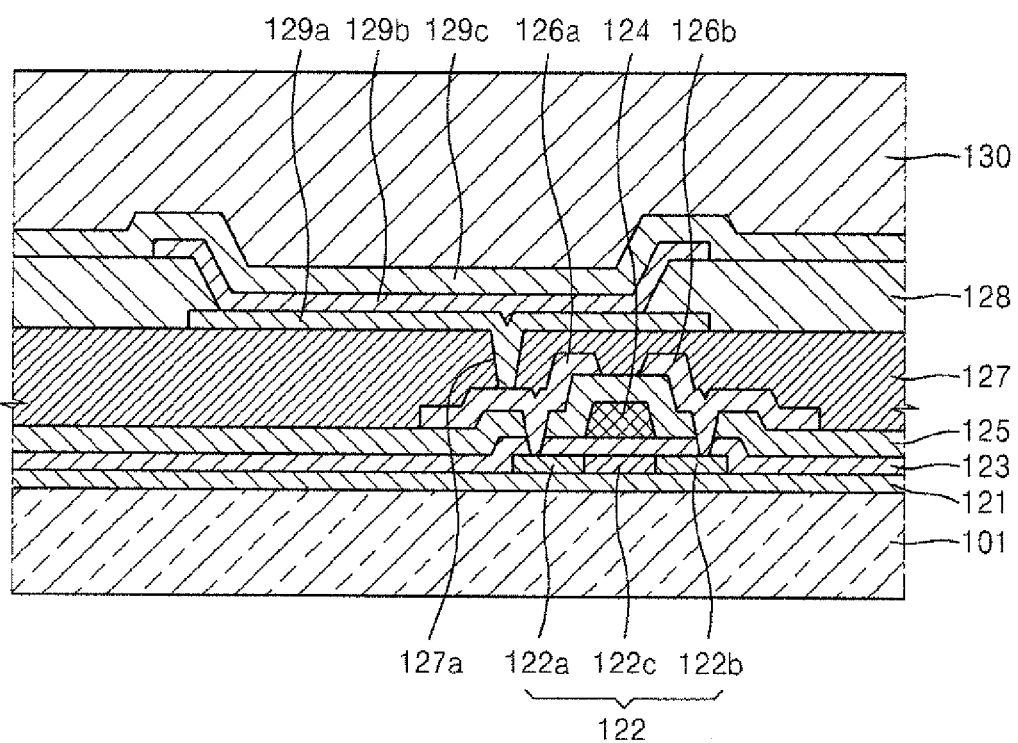
FIG. 2 is a cross-sectional view of an example of a pixel, including an organic light emitting diode (OLED), which is included in a display area illustrated in FIG. 1.

FIG. 2 is a cross-sectional view of an example of a pixel, including an organic light emitting diode (OLED), which is included in the display area illustrated in FIG. 1.

Referring to FIG. 2, an insulating layer 121, such as a barrier layer and/or a buffer layer, may be formed on an upper surface of the first substrate 101 in order to prevent diffusion of impurity ions and penetration of moisture or external air, and to achieve surface planarization.

An active layer 122 of a TFT is formed on the insulating layer 121 by using a semiconductor, and a gate insulating layer 123 is formed so as to cover the active layer 122 and the insulating layer 121. The active layer 122 may be formed of an organic semiconductor or an inorganic semiconductor, such as amorphous silicon or polysilicon, and includes a source region 122a, a drain region 122b, and a channel region 122c between the source and drain regions 122a and 122b, respectively.

A gate electrode 124 is formed on the gate insulating layer 123 corresponding to the active layer 122, and an interlayer insulating layer 125 is formed so as to cover the gate electrode 124 and the gate insulating layer 123. Then, a source electrode 126a and a drain electrode 126b are formed on the interlayer insulating layer 125, and a planarization layer 127 and a pixel defining layer 128 are sequentially formed so as to cover the source and drain electrodes 126a and 126b, respectively, and the interlayer insulating layer 125.

Each of the gate insulating layer 123, the interlayer insulating layer 125, the planarization layer 127, and the pixel defining layer 128 may be formed of an insulator, are formed as a single layer or a plurality of layers, and may be formed of an organic material, an inorganic material, or a stack of organic and inorganic materials.

The TFT is not limited to the above-described stacked structure, and various structures may be used to implement the TFT.

Meanwhile, a pixel electrode 129a of the OLED is formed on the planarization layer 127, the pixel defining layer 128 is formed on the pixel electrode 129a and the planarization layer 127, the pixel electrode 129a is exposed by forming a predetermined opening in the pixel defining layer 128, and then an organic emission layer 129b of the OLED is formed in the opening.

The OLED emits red, green, or blue light according to the flow of a current for displaying predetermined image data, and includes the pixel electrode 129a contacting the drain electrode 126b of the TFT through a contact hole, a counter electrode 129c covering all pixels, and the organic emission layer 129b disposed between the pixel electrode 129a and counter electrode 129c so as to emit light.

The pixel and counter electrodes 129a and 129c, respectively, are insulated from each other by the organic emission layer 129b, and apply different-polarity voltages to the organic emission layer 129b so as to allow the organic emission layer 129b to emit light.

The organic emission layer 129b may be a low-molecular or high-molecular organic layer, may be formed as a monolayer from among, or a stacked multilayer of, a hole injection layer (HIL), a hole transport layer (HTL), an emission layer (EML), an electron transport layer (ETL), an electron injection layer (EIL), etc., and may be formed of one of various organic materials such as copper phthalocyanine (CuPc), N,N'-Di(naphthalene-1-yl)-N,N'-diphenyl-benzidine (NPB), and tris-8-hydroxyquinoline aluminum (Alq3). The above organic layers may be formed by using a vacuum deposition method. In this case, the HIL, the HTL, the ETL and the EIL are common layers, and may be commonly applied to red, green and blue pixels. Accordingly, unlike FIG. 2, the common layers may be formed so as to cover all pixels together with the counter electrode 129c.

The pixel electrode 129a functions as an anode and the counter electrode 129c functions as a cathode. The polarities of the pixel and counter electrodes 129a and 129c, respectively, may be exchanged.

In a bottom-emission display for displaying an image in a direction toward the first substrate 101, the pixel electrode 129a may be formed as a transparent electrode and the counter electrode 129c may be formed as a reflective electrode. In this case, the pixel electrode 129a may be formed of a transparent conductive material having a high work function, e.g., indium tin oxide (ITO), indium zinc oxide (IZO), zinc oxide (ZnO), or indium oxide ($In_2O_3$), and the counter electrode 129c may be formed of metal having a low work function, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

In a top-emission display for displaying an image in a direction toward the counter electrode 129c, the pixel electrode 129a may be formed as a reflective electrode and the counter electrode 129c may be formed as a transparent electrode. In this case, the pixel electrode 129a formed as a reflective electrode may include a reflective layer formed of Ag, Mg, Al, Pt, Pd, Au, Ni, Nd, Ir, Cr, Li, Ca, or a mixture thereof, and a transparent conductive material having a high work function, e.g., ITO, IZO, ZnO, or $In_2O_3$. The counter electrode 129c formed as a transparent electrode may be formed by depositing metal having a low work function, e.g., Ag, Mg, Al, Pt, Pd, Au, Ni, Nd, Ir, Cr, Li, Ca, or a mixture thereof, and then forming an auxiliary electrode layer or a bus electrode line on the deposited metal by using a transparent conductive material such as ITO, IZO, ZnO, or $In_2O_3$.

In a dual-emission display, both of the pixel and counter electrodes 129a and 129c, respectively, may be formed as transparent electrodes.

If the first substrate 101 is installed on a frame (not shown), a top-emission display for displaying an image in a direction toward the second substrate 102 may be obtained. Although not shown in FIG. 2, if a predetermined opening is formed in the frame, a bottom surface of the first substrate 101 is exposed through the opening, and a bottom-emission display or a dual-emission display may also be obtained.

The pixel and counter electrodes 129a and 129c, respectively, are not limited to the above-mentioned materials and may be formed of, for example, a conductive organic material or a conductive paste including conductive particles of Ag, Mg, or Cu. If a conductive paste is used, the conductive paste may be printed by using an inkjet printing method, and then may be baked into an electrode.

A passivation layer 130, formed of an organic material, an inorganic material, or a stack of organic and inorganic materials, may be formed on an upper surface of the counter electrode 129c so as to cover the OLED.

Figure 3:
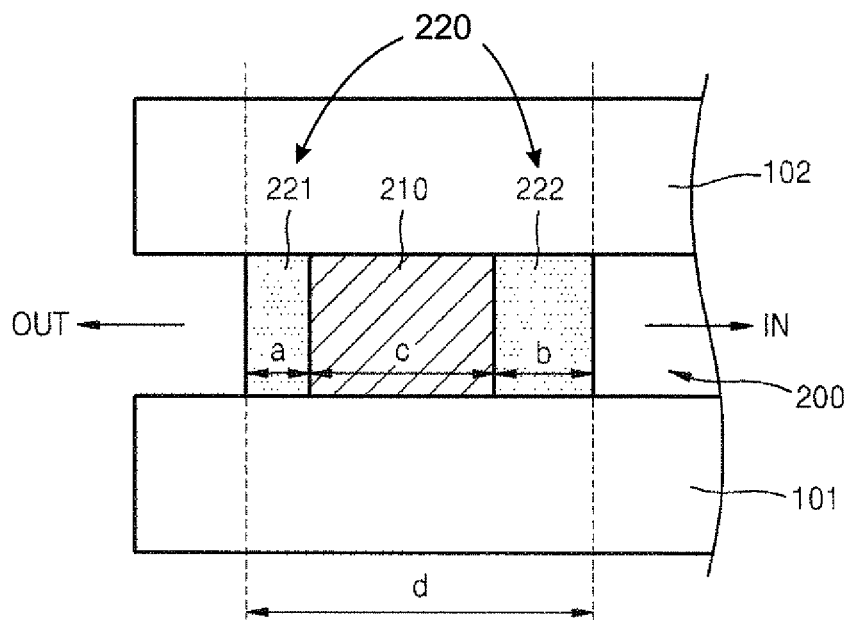
FIG. 3 is a detailed cross-sectional view of the organic light emitting display apparatus illustrated in FIG. 1 according to the first embodiment of the present invention.

FIG. 3 is a detailed cross-sectional view of the organic light emitting display apparatus illustrated in FIG. 1 according to the first embodiment of the present invention.

Referring to FIG. 3, it is shown that, in the organic light emitting display apparatus 100, the width b of the inner non-effective bonding portion 222 is greater than the width a of the outer non-effective bonding portion 221. In other words, the effective bonding portion 210 is inclined toward the outer portion OUT. The effective bonding portion 210 is a portion substantially involved in bonding between the first and second substrates 101 and 102, respectively, is completely melted to adhere to the first and second substrates 101 and 102, respectively, and thus does not have cracks. However, unlike the effective bonding portion 210, cracks may probably occur in the non-effective bonding portion 220. Also, if the non-effective bonding portion 220 has a large width, the probability of crack occurrence may be increased. According to the current embodiment of the present invention, by reducing the width a of the outer non-effective bonding portion 221 disposed adjacent to the outer portion OUT, cracks may not occur in the bonding portion adjacent to the outer portion OUT. Since cracks do not occur in the bonding portion adjacent to the outer portion OUT, penetration of moisture in a cleaning process may be prevented, and the rate of defects caused by moisture penetration may be reduced, and thus improved.

According to the current embodiment of the present invention, the width a of the outer non-effective bonding portion 221 may be equal to or less than about 15% of a width d of the bonding member 200 as represented by Equation 1. In this regard, a lower limit of the width a may be about 0.01%.

$$a \leq d \times 0.15 \qquad \text{[Equation 1]}$$

If the width a of the outer non-effective bonding portion 221 is greater than about 15% of the width d of the bonding member 200, the width a of the outer non-effective bonding portion 221 exceeds a threshold value for preventing cracks, and thus the probability of crack occurrence is greatly increased. Otherwise, if the width a of the outer non-effective bonding portion 221 is less than about 0.01% of the width d of the bonding member 200, the outer non-effective bonding portion 221 may not be viewed with bare eyes.

According to the current embodiment of the present invention, a width c of the effective bonding portion 210 may be equal to or greater than about 70% of the width d of the bonding member 200, and equal to or less than 90% of the width d of the bonding member 200, as represented by Equation 2.

$$(d \times 0.7) \leq c \leq (d \times 0.9) \qquad \text{[Equation 2]}$$

If the width c of the effective bonding portion 210 is less than about 70% of the width d of the bonding member 200, a bonding force between the first and second substrates 101 and 102, respectively, may be greatly reduced. If the width c of the effective bonding portion 210 is greater than about 90% of the width d of the bonding member 200, a large amount of power of a laser beam may be consumed. For example, if the width d of the bonding member 200 is about 600 μm, the width c of the effective bonding portion 210 may be equal to or greater than about 420 μm, and the width a of the outer non-effective bonding portion 221 may be equal to or less than about 90 μm.

Figure 4:
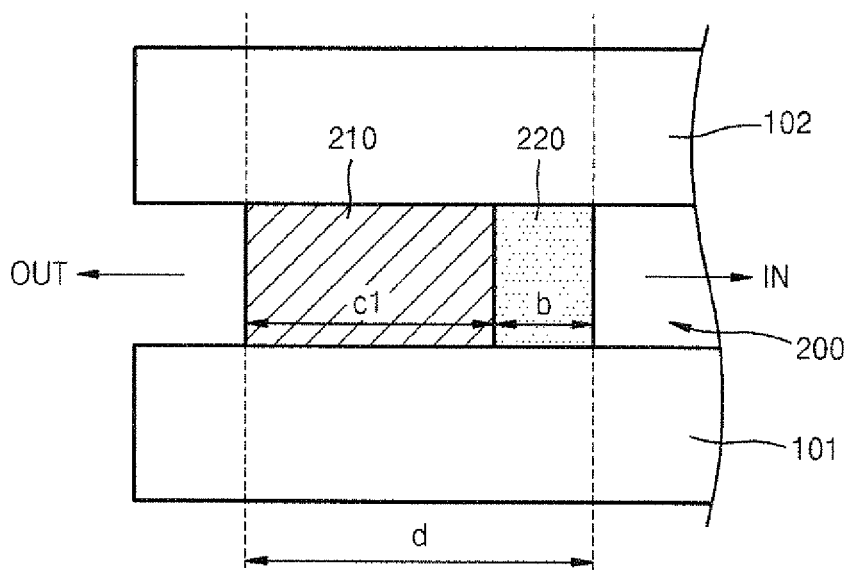
FIG. 4 is a detailed cross-sectional view of the organic light emitting display apparatus illustrated in FIG. 1 according to a second embodiment of the present invention.

FIG. 4 is a detailed cross-sectional view of the organic light emitting display apparatus illustrated in FIG. 1 according to a second embodiment of the present invention;

In FIG. 4, components corresponding to the components described above in relation to FIGS. 1 and 3 function the same as, or similarly to, the above-described components, and thus detailed descriptions thereof will not be provided here.

Referring to FIG. 4, the bonding member 200 forms a bonding portion including the effective bonding portion 210 disposed adjacent to the outer portion OUT and the non-effective bonding portion 220 disposed adjacent to the inner portion IN. Unlike FIGS. 1 and 3, in FIG. 4, the effective bonding portion 210 is formed immediately adjacent to the outer portion OUT and the outer non-effective bonding portion 221 does not exist.

According to the current embodiment of the present invention, by not forming the outer non-effective bonding portion 221 adjacent to the outer portion OUT, and forming only the effective bonding portion 210 adjacent to the outer portion OUT, no crack may occur in the bonding portion adjacent to the outer portion OUT. Since cracks do not occur in the bonding portion adjacent to the outer portion OUT, penetration of moisture in a cleaning process may be prevented and the rate of defects caused by moisture penetration may be reduced, and thus improved.

Also, according to the current embodiment of the present invention, a width c1 of the effective bonding portion 210 may be equal to or greater than about 70% of the width d of the bonding member 200, and equal to or less than 90% of the width d of the bonding member 200, as represented by Equation 2.

If the width c1 of the effective bonding portion 210 is less than about 70% of the width d of the bonding member 200, a bonding force between the first and second substrates 101 and 102, respectively, may be greatly reduced. If the width c1 of the effective bonding portion 210 is greater than about 90% of the width d of the bonding member 200, a large amount of power of a laser beam may be consumed.

FIGS. 5 thru 8 are cross-sectional views for describing a method of manufacturing the organic light emitting display apparatus illustrated in FIG. 1 according to an embodiment of the present invention.

Figure 5:
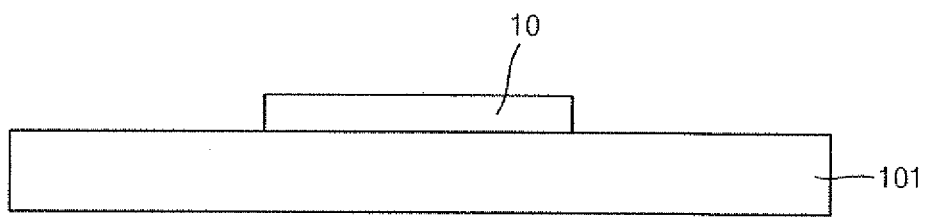
FIGS. 5 thru 8 are cross-sectional views for describing a method of manufacturing the organic light emitting display apparatus illustrated in FIG. 1 according to an embodiment of the present invention.

Referring to FIG. 5, initially, the first substrate 101 is provided. One surface of the first substrate 101 is divided into the non-display area NDA and the display area DA. The display area DA includes the display unit 10 in which pixels, each including an OLED, a TFT, a capacitor, etc., are formed in a matrix.

Figure 6:
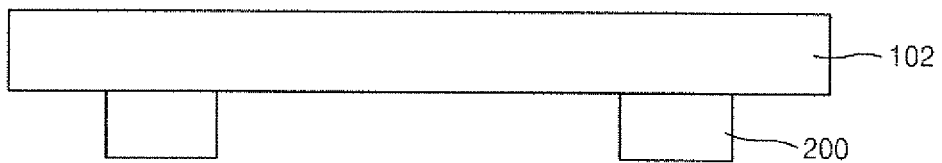

Referring to FIG. 6, the bonding member 200 is disposed on one surface of the second substrate 102. In this case, the bonding member 200 is disposed so as to surround the display area DA of the first substrate 101. Also, the bonding member 200 is disposed so as to define the inner and outer portions IN and OUT, respectively, when the first and second substrates 101 and 102, respectively, are bonded to each other. Here, the inner portion IN is a portion inside the bonding member 200 and includes the display area DA, and the outer portion OUT is a portion outside the bonding member 200 and includes the non-display area NDA. However, the bonding member 200 is not limited thereto, and may be disposed on one surface of the first substrate 101 so as to surround the display area DA.

Figure 7:
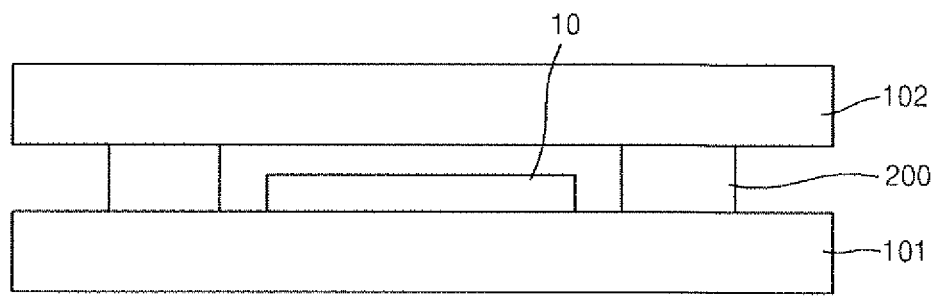

Referring to FIG. 7, the second substrate 102 is disposed on the first substrate 101 in such a way that the one surface of the first substrate 101 faces the one surface of the second substrate 102.

Figure 8:
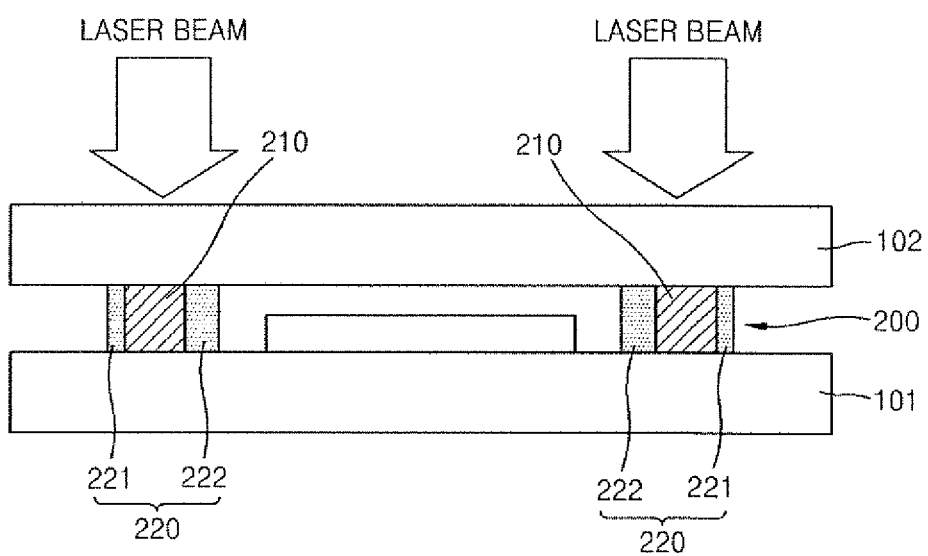

Referring to FIG. 8, a laser beam is irradiated onto another surface of the second substrate 102 so as to correspond to the position of the bonding member 200. However, the laser beam is not limited thereto, and may be irradiated onto another surface of the first substrate 101 or simultaneously onto the other surfaces of the first and second substrates 101 and 102, respectively, so as to correspond to the position of the bonding member 200. Then, the bonding member 200 is melted by the laser beam so as to form a bonding portion including the effective and non-effective bonding portions 210 and 220, respectively, and to bond the first and second substrates 101 and 102, respectively, to each other.

Figure 9:
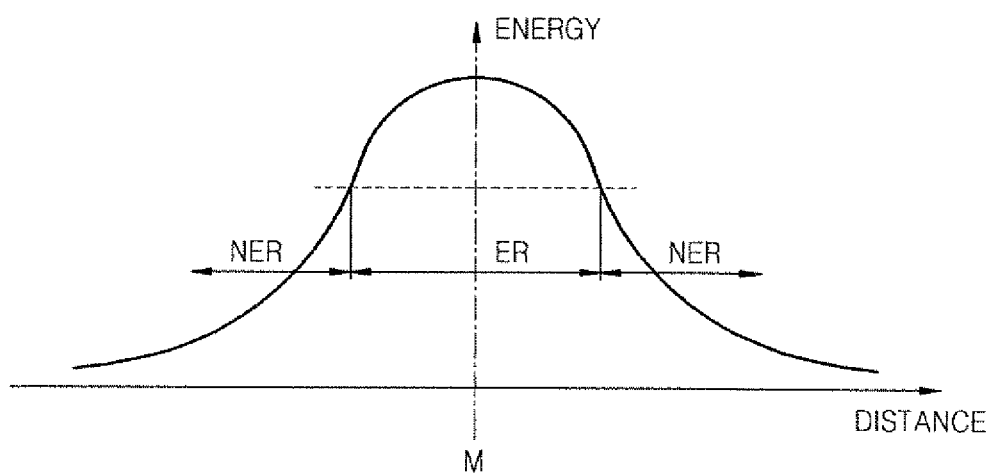
FIG. 9 is a graph showing energy intensity of a laser beam according to an embodiment of the present invention.
Figure 10:
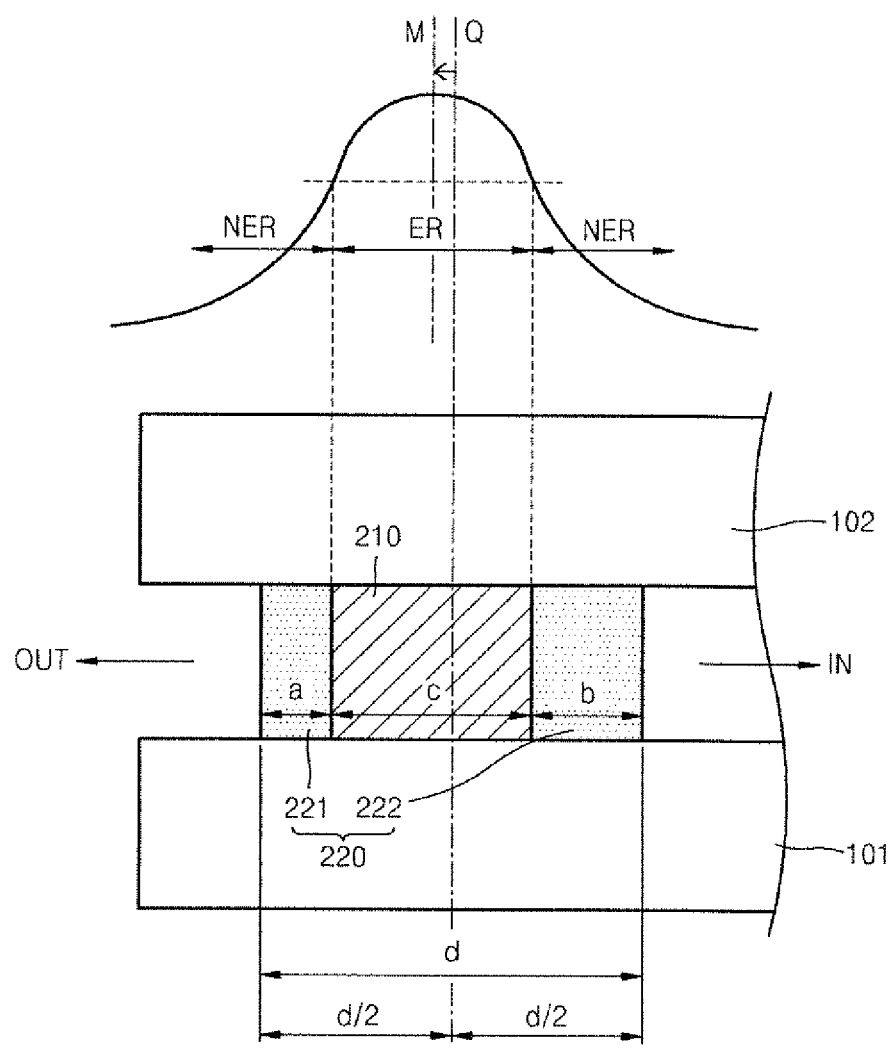
FIG. 10 is a detailed cross-sectional view for describing a method of manufacturing the organic light emitting display apparatus illustrated in FIG. 3 according to the first embodiment of the present invention.
Figure 11:
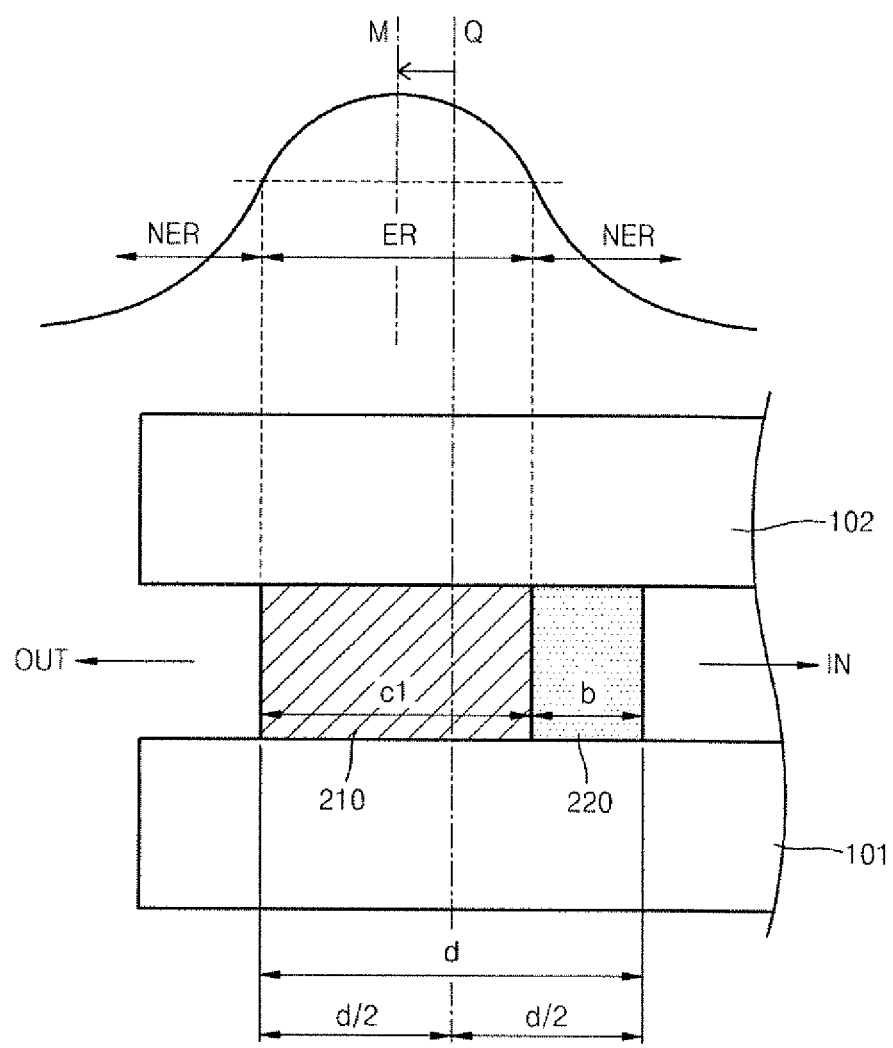
FIG. 11 is a detailed cross-sectional view for describing a method of manufacturing the organic light emitting display apparatus illustrated in FIG. 4 according to the second embodiment of the present invention.

According to the current embodiment of the present invention, the laser beam is irradiated in such a way that a central axis M in FIGS. 9 thru 11 of the laser beam is biased toward the outer portion OUT from a center Q in FIGS. 10 and 11 of the width d of the bonding member 200. As such, by forming the effective bonding portion 210 at a predetermined position, cracks occurring in the bonding portion adjacent to the outer portion OUT may be reduced or prevented, and the defect rate of the organic light emitting display apparatus 100 may be reduced, and thus improved.

FIG. 9 is a graph showing energy intensity of a laser beam according to an embodiment of the present invention.

Referring to FIG. 9, the laser beam may have a Gaussian distribution. In an energy distribution according to the diameter of the laser beam, energy is highest at the central axis M of the laser beam and is reduced according to the function of a distance from the central axis M. The laser beam is irradiated onto a substrate in the form of a spot or a line. However, the form of the laser beam is not limited thereto.

According to the current embodiment of the present invention, the laser beam includes the effective energy range ER and the non-effective energy range NER. Here, the effective energy range ER is a range of energy capable of forming the effective bonding portion 210 when irradiated onto the bonding member 200. On the other hand, the non-effective energy range NER is a range of energy capable of forming the non-effective bonding portion 220 when irradiated onto the bonding member 200. In FIG. 9, the effective energy range ER is a range corresponding to about 60% to about 80% of a total width of the laser beam with respect to the central axis M of the laser beam. That is, the effective energy range ER includes a range corresponding to about 30% to about 40% of a left portion of the laser beam and another energy range corresponding to about 30% to about 40% of a right portion of the laser beam with respect to the central axis M of the laser beam. Meanwhile, a range other than the effective energy range ER corresponds to the non-effective energy range NER.

In the latter regard, if the effective energy range ER is less than about 60% of the width of the laser beam, the effective bonding portion 210 may not have a sufficient width to bond the first and second substrates 101 and 102, respectively, to each other. Otherwise, if the effective energy range ER is greater than about 80% of the width of the laser beam, the effective bonding portion 210 may not have a uniform bonding force.

FIG. 10 is a detailed cross-sectional view for describing a method of manufacturing the organic light emitting display apparatus illustrated in FIG. 3 according to the first embodiment of the present invention.

Referring to FIG. 10, when a laser beam is irradiated, the effective energy range ER of the laser beam is irradiated so as to be biased toward the outer portion OUT. In more detail, the inner non-effective bonding portion 222 disposed adjacent to the inner portion IN and the outer non-effective bonding portion 221 disposed adjacent to the outer portion OUT are formed by interposing the effective bonding portion 210 therebetween, and the effective energy range ER of the laser beam is irradiated so as to be biased toward the outer portion OUT in such a way that the width b of the inner non-effective bonding portion 222 is greater than the width a of the outer non-effective bonding portion 221.

According to the current embodiment of the present invention, the effective energy range ER of the laser beam may be irradiated so as to be biased toward the outer portion OUT in such a way that the width a of the outer non-effective bonding portion 221 is equal to or less than about 15% of the width d of the bonding member 200. In this regard, a lower limit of the width a of the outer non-effective bonding portion 221 is described above in relation to FIG. 3, and thus will not be described here.

According to the current embodiment of the present invention, the effective bonding portion 210 is formed so as to be biased toward the outer portion OUT by adjusting a position for irradiating the laser beam without adding or changing a laser irradiation apparatus. As such, by reducing the width a of the outer non-effective bonding portion 221 disposed adjacent to the outer portion OUT, cracks may not occur in a bonding portion adjacent to the outer portion OUT. Since cracks do not occur in the bonding portion adjacent to the outer portion OUT, penetration of moisture in a cleaning process may be prevented and the rate of defects caused by moisture penetration may be reduced, and thus improved. Also, since an additional process is not required and equipment does not need to be changed, a financially, temporally, and spatially efficient process may be performed.

FIG. 11 is a detailed cross-sectional view for describing a method of manufacturing the organic light emitting display apparatus illustrated in FIG. 4 according to the second embodiment of the present invention.

Referring to FIG. 11, when a laser beam is irradiated, the effective energy range ER of the laser beam is irradiated so as to be further biased toward the outer portion OUT. In more detail, the effective energy range ER of the laser beam is irradiated so as to be biased toward the outer portion OUT in such a way that the effective bonding portion 210 is disposed adjacent to the outer portion OUT and the non-effective bonding portion 220 is disposed adjacent to the inner portion IN.

According to the current embodiment of the present invention, the effective bonding portion 210 is formed so as to be biased toward the outer portion OUT by adjusting a position for irradiating the laser beam without adding or changing a laser irradiation apparatus. As such, by forming only the effective bonding portion 210 adjacent to the outer portion OUT, no crack may occur in a bonding portion adjacent to the outer portion OUT. Since cracks do not occur in the bonding portion adjacent to the outer portion OUT, penetration of moisture in a cleaning process may be prevented and the rate of defects caused by moisture penetration may be reduced, and thus improved.

Although only an organic light emitting display apparatus is described above, the above embodiments of the present invention may also be applied to flat panel display apparatuses such as a liquid crystal display apparatus and a plasma display apparatus, in which a lower substrate is encapsulated by using an upper substrate and a sealing member.

According to the above embodiments of the present invention, by forming an effective bonding portion substantially involved in bonding between substrates, adjacent to an outer portion, cracks occurring in a bonding portion adjacent to the outer portion may be prevented and the rate of defects caused by penetration of moisture in a process may be reduced, and thus improved.

Also, cracks occurring in the bonding portion adjacent to the outer portion may be reduced by adjusting a position for irradiating a laser beam without adding or changing process equipment.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light emitting display apparatus, comprising:
    a first substrate having a first surface which is divided into a non-display area and a display area comprising an organic light emitting diode (OLED);
    a second substrate having a first surface which faces the first surface of the first substrate; and
    a bonding member disposed between the first and second substrates so as to surround the display area of the first substrate, and bonding the first and second substrates to each other so as to define an inner portion comprising the display area and an outer portion comprising the non-display area;
    wherein a bonding portion formed by the bonding member comprises an effective bonding portion disposed immediately adjacent to the outer portion and a non-effective bonding portion disposed immediately adjacent to the inner portion;
    wherein a height of the effective bonding portion is equal to a height of the non-effective bonding portion.

2. The organic light emitting display apparatus of claim 1, wherein the bonding member is melted by a laser beam irradiated onto one of a second surface of the first substrate and a second surface of the second substrate so as to form the bonding portion.

3. The organic light emitting display apparatus of claim 1, wherein a width of the effective bonding portion is not less than 70% of a width of the bonding member and not greater than 90% of the width of the bonding member.

4. A method of manufacturing an organic light emitting display apparatus, the method comprising the steps of:
    providing a first substrate having a first surface which is divided into a non-display area and a display area comprising an organic light emitting diode (OLED);
    disposing a bonding member on a first surface of a second substrate surrounding the display area of the first substrate and defining an inner portion comprising the display area and an outer portion comprising the non-display;
    disposing the second substrate on the first substrate having the first surface of the second substrate facing the first surface of the first substrate;
    irradiating a laser beam onto one of a second surface of the first substrate and a second surface of the second substrate in correspondence with a position of the bonding member; and
    bonding the first and second substrates to each other as the bonding member is melted by the laser beam so as to form a bonding portion comprising an effective bonding portion disposed immediately adjacent to the outer portion and a non-effective bonding portion disposed immediately adjacent to the inner portion, a height of the effective bonding portion being equal to a height of the non-effective bonding portion;
    wherein the laser beam is irradiated with a central axis of the laser beam biased toward the outer portion from a center of a width of the bonding member.

5. The method of claim 4,
    wherein the laser beam has a Gaussian distribution, and
    wherein energy is highest at the central axis of the laser beam.

6. The method of claim 4,
    wherein e laser beam has an elective energy range for forming the effective bonding portion and a non-effective energy range for forming the non-effective bonding portion; and
    wherein the effective energy range is a range corresponding to 60% to 80% of a total width of the laser beam with respect to the central axis of the laser beam.

* * * * *